(12) United States Patent
Nam et al.

(10) Patent No.: US 9,411,089 B2
(45) Date of Patent: Aug. 9, 2016

(54) LIGHT SOURCE MODULE AND BACKLIGHT UNIT HAVING THE SAME

(71) Applicant: SEOUL SEMICONDUCTOR CO., LTD., Ansan-si (KR)

(72) Inventors: Ki Bum Nam, Ansan-si (KR); Yu Dae Han, Ansan-si (KR); Chung Hoon Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 49 days.

(21) Appl. No.: 14/472,542

(22) Filed: Aug. 29, 2014

(65) Prior Publication Data

US 2015/0062966 A1    Mar. 5, 2015

(30) Foreign Application Priority Data

Aug. 29, 2013    (KR) .................. 10-2013-0103207

(51) Int. Cl.
| | |
|---|---|
| F21V 8/00 | (2006.01) |
| H01L 33/20 | (2010.01) |
| H01L 33/46 | (2010.01) |
| F21Y 101/02 | (2006.01) |
| H01L 33/50 | (2010.01) |

(52) U.S. Cl.
CPC .............. *G02B 6/0031* (2013.01); *H01L 33/20* (2013.01); *H01L 33/46* (2013.01); *F21Y 2101/02* (2013.01); *G02B 6/0073* (2013.01); *G02B 6/0083* (2013.01); *H01L 33/505* (2013.01); *H01L 2224/14* (2013.01)

(58) Field of Classification Search
CPC .... G02B 6/0031; G02B 6/0073; H01L 33/20; H01L 33/46; H01L 33/505; H01L 2224/14
USPC .............. 362/612, 613, 311.02, 249.02, 608, 362/609, 610
See application file for complete search history.

(56) References Cited

U.S. PATENT DOCUMENTS

| | | | | |
|---|---|---|---|---|
| 6,784,460 | B2 * | 8/2004 | Ng .......................... | H01L 33/20 257/100 |
| 2005/0023545 | A1 * | 2/2005 | Camras ................... | H01L 33/58 257/98 |
| 2007/0258246 | A1 * | 11/2007 | Leatherdale ............. | G02B 5/04 362/326 |
| 2010/0156657 | A1 * | 6/2010 | Lee ........................ | G02B 6/0028 340/815.4 |
| 2011/0079807 | A1 * | 4/2011 | Chen ...................... | H01L 33/58 257/98 |
| 2012/0280261 | A1 * | 11/2012 | Tarsa ...................... | H01L 33/20 257/98 |
| 2012/0293730 | A1 * | 11/2012 | Ueyama ............... | G02B 6/0068 348/790 |

* cited by examiner

*Primary Examiner* — Laura Tso
(74) *Attorney, Agent, or Firm* — H.C. Park & Associates, PLC

(57) ABSTRACT

A light source module includes a circuit board, board pads disposed on the circuit board, and a light emitting diode chip disposed on the board pads. The light emitting diode chip includes a substrate and a semiconductor stacking part disposed between the substrate and the circuit board, and the substrate includes an inclined part disposed at an upper portion thereof and a discharging part disposed at one side surface thereof.

18 Claims, 4 Drawing Sheets

LIGHT SOURCE MODULE AND BACKLIGHT UNIT HAVING THE SAME

CROSS-REFERENCE TO RELATED APPLICATION

This application claims priority from and the benefit of Korean Patent Application No. 10-2013-0103207, filed on Aug. 29, 2013, which is hereby incorporated by reference for all purposes as if fully set forth herein.

BACKGROUND

1. Field

Exemplary embodiments of the present invention relate to a light source module, and more particularly, to a light source module capable of being implemented so as to be thin and having excellent light efficiency and heat radiation characteristics, and a backlight unit having the same.

2. Discussion of the Background

Backlight units have been widely used in display devices or surface illuminators, for providing light to liquid crystal displays.

The backlight unit included in a liquid crystal display may be divided into a direct type backlight unit and an edge type backlight unit depending on a position of a light emitting device in the backlight unit.

The direct type backlight unit, which may be employed in liquid crystal displays of 20 inches or more, and may include light sources disposed on a lower surface of a diffusing plate to directly irradiate light to a front surface of a liquid crystal display panel. Since the direct type backlight unit may have a light use efficiency greater than that of the edge type backlight unit, it may be used in a large screen liquid crystal display requiring high luminance.

The edge type backlight unit, which may be used in a liquid crystal display having a relatively small size, such as a laptop computer monitor and a desktop computer, has good light uniformity, a long lifespan, and may decrease the thickness of the liquid crystal display.

In the edge type backlight unit, a thin light emitting diode package having low power consumption may be mounted on a board and on an inner surface of the backlight unit.

However, it may be difficult to reduce the thickness of the edge type backlight unit including the light emitting diode package, in accordance with increasing demand by a user, and it may be difficult to use a high efficiency light emitting diode chip in the edge type backlight unit due to deterioration of heat radiation characteristics caused by the light emitting diode package.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a light source module having high output, high efficiency, and reduced thickness.

Exemplary embodiments of the present invention also provide a light source module capable of being implemented so as to have reduced thickness and using a high efficiency light emitting diode chip.

Exemplary embodiments of the present invention also provide a technology capable of reducing the thickness of a backlight unit.

Additional features of the invention will be set forth in the description which follows, and in part will be apparent from the description, or may be learned by practice of the invention.

An exemplary embodiment of the present invention discloses a light source module including: a circuit board having board pads exposed on one surface thereof; and a light emitting diode chip positioned on the circuit board, wherein the light emitting diode chip includes a substrate and a semiconductor stacking part positioned beneath the substrate, the substrate including an inclined part positioned at an upper portion thereof and a discharging part positioned at one side surface thereof, such that it is advantageous in high output, high efficiency, thinness, and heat radiation.

An exemplary embodiment of the present invention also discloses a backlight unit including: a light guide plate; a circuit board positioned at at least one side of the light guide plate and having board pads exposed on one surface thereof; and a light emitting diode chip positioned on the circuit board, wherein the light emitting diode chip includes a substrate and a semiconductor stacking part positioned beneath the substrate, the substrate including an inclined part positioned at an upper portion thereof and a discharging part positioned at one side surface thereof, such that it is advantageous in high output, high efficiency, slimness, and heat radiation.

The discharging part and an incident surface of the light guide plate may face each other.

The inclined part may have a predetermined inclined angle based on the semiconductor stacking part.

The inclined part may have an inclined stair structure in which it includes a plurality of inclined parts.

The inclined part may have an inclined stair structure in which it includes a plurality of inclined parts and a plurality of horizontal parts.

The inclined part may include a plurality of inclined parts, inclined angles formed by the plurality of inclined parts and the semiconductor stacking parts may be the same as each other, and the plurality of inclined parts may be formed in parallel with each other in a state in which they are spaced apart from each other by a predetermined interval.

The inclined part may include a plurality of inclined parts, inclined angles formed by the plurality of inclined parts and the semiconductor stacking parts may be different from each other.

The backlight unit may further include a wavelength converting layer positioned on the discharging part.

The wavelength converting layer may be extended up to one side surface of the semiconductor stacking part.

The backlight unit may further include a DBR or a thin film metal layer positioned on the inclined part.

The backlight unit may further include a wavelength converting layer positioned on the DBR or the thin film metal layer.

The DBR or the thin film metal layer may be extended up to the other side surface of the semiconductor stacking part.

The discharging part may be provided with a rugged part having a rugged shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
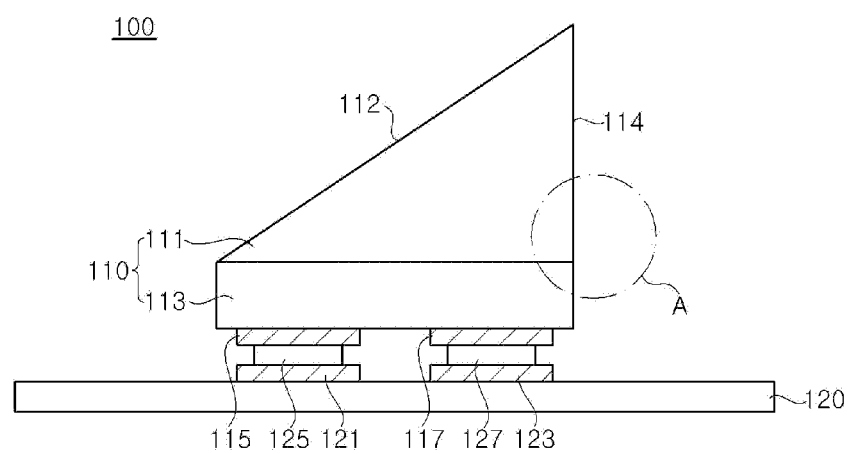
FIG. 1 is a cross-sectional view schematically showing a light source module according to an exemplary embodiment of the present invention.

Hereinafter, exemplary embodiments of the present invention will be described in detail with reference to the accompanying drawings. Exemplary embodiments to be provided below are provided by way of example so that the idea of the present invention can be sufficiently transferred to those skilled in the art. Therefore, the present invention is not limited to exemplary embodiments to be described below, but may be implemented in other forms. In addition, in the accompanying drawings, shapes, and the like, of components may be exaggerated. Like reference numerals denote like components throughout the present specification. Modifications of components without departing from the scope of the present invention do not include restrictive meanings, but are descriptions for clearly representing a technical idea of the present invention and may be restricted by only contents mentioned in the claims.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, exemplary embodiments of the present invention will be described in detail with reference to the accompanying drawings so that those skilled in the art may easily practice the present invention.

Figure 2:
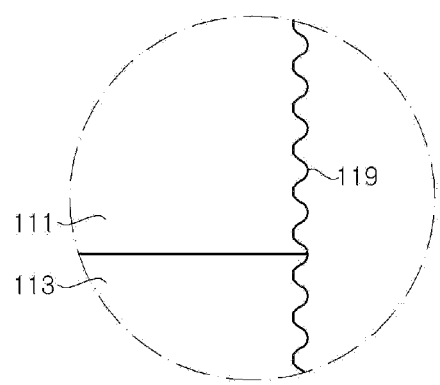
FIG. 2 is a view showing a region A of FIG. 1.

FIG. 1 is a cross-sectional view schematically showing a light source module according to an exemplary embodiment of the present invention, and FIG. 2 is a view showing a region A of FIG. 1.

As shown in FIGS. 1 and 2, a light source module 100 according to the present exemplary embodiment includes a light emitting diode chip 110 and a circuit board 120.

The light emitting diode chip 110 includes a substrate 111 and a semiconductor stacking part 113. The light emitting diode chip 110 further includes electrode pads 115 and 117 positioned beneath the semiconductor stacking part 113.

The light emitting diode chip 110, which is a flip chip, has the electrode pads 115 and 117 positioned therebeneath.

The substrate 111 may be a growth substrate for growing a semiconductor layer, for example, a sapphire substrate or a gallium nitride substrate. Particularly, in the case in which the substrate 111 is the sapphire substrate, a refractive index is gradually decreased from the semiconductor stacking part 113 to the sapphire substrate 111, such that light extraction efficiency may be improved.

The substrate 111 includes an inclined part 112 and a discharging part 114.

The inclined part 112 reflects light emitted from the semiconductor stacking part 113 to the discharging part 114. The inclined part 112 has an inclined angle with reference to an upper surface of the semiconductor stacking part 113.

A method of manufacturing the substrate 111 according to the present exemplary embodiment includes growing semiconductor stacking parts 113 on one surface of a wafer, forming an inclined scribing pattern on the other surface of the wafer by a scribing process, and forming an insulating pattern on the other surface of the wafer and then etching towards the inclined scribing pattern using an etching process, to form the inclined part 112.

The discharging part 114, which is a surface of the substrate 111 that discharges light, including the light reflected from the inclined part 112 and light directly provided from the semiconductor stacking part 113. The discharging part 114 may be one side surface of the light emitting diode chip 110, and is formed in a vertical direction extending from a lower surface of the light emitting diode chip 110. The discharging part 114 may be formed by separating the wafer into a unit light emitting diode chip 110 by cutting after forming the inclined part 112.

A rugged part 119 having a rugged structure is formed on the discharging part 114 and one side surface of the semiconductor stacking part 113. The rugged part 119 according to the present exemplary embodiment has convex parts and concave parts having a round shape are formed so that light may be easily extracted. The rugged part 119 may also be formed on only the discharging part 114.

The semiconductor stacking part 113 is formed of a gallium nitride based compound semiconductor and may emit ultraviolet or blue light.

In the light source module 100 according to the present exemplary embodiment, the light emitting diode chip 110 is directly mounted on the circuit board 120. The light emitting diode chip 110 is flip-chip bonded without using a bonding wire, such that it is electrically connected directly to board pads 121 and 123 on the circuit board 120. Here, the electrode pads 115 and 117 exposed on the lower surface of the light emitting diode chip 110 and the board pads 121 and 123 have bumpers 125 and 127 positioned therebetween, respectively. Since the light source module 100 according to the present exemplary embodiment does not use a bonding wire, it does not require a molding part for protecting the wire. Therefore, the flip-chip type light emitting diode chip 110 makes it possible to reduce a color deviation or a luminance blurring phenomenon and simplify a module manufacturing process as compared with using the bonding wire. Alternatively, the light emitting diode chip 110 may be mounted on the circuit board 120 by a surface mounting technology (SMT). The SMT may attach the light emitting diode chip 110 to the circuit board 120 using a solder. The solder may include a metal paste or an alloy such as AuSn, NiSn, or the like.

As described above, the light source module 100 according to the present exemplary embodiment includes the inclined part 112 that both reduces thickness and has high efficiency, and the discharging part 114 positioned at a side surface of the light emitting diode chip 110, such that the light source module 100 may be implemented in a side surface light emitting device.

In addition, the light source module 100 according to the present exemplary embodiment has excellent heat radiation characteristics since the light emitting diode chip 110 is mounted on the circuit board 120 by the flip-chip bonding or SMT.

Figure 3:
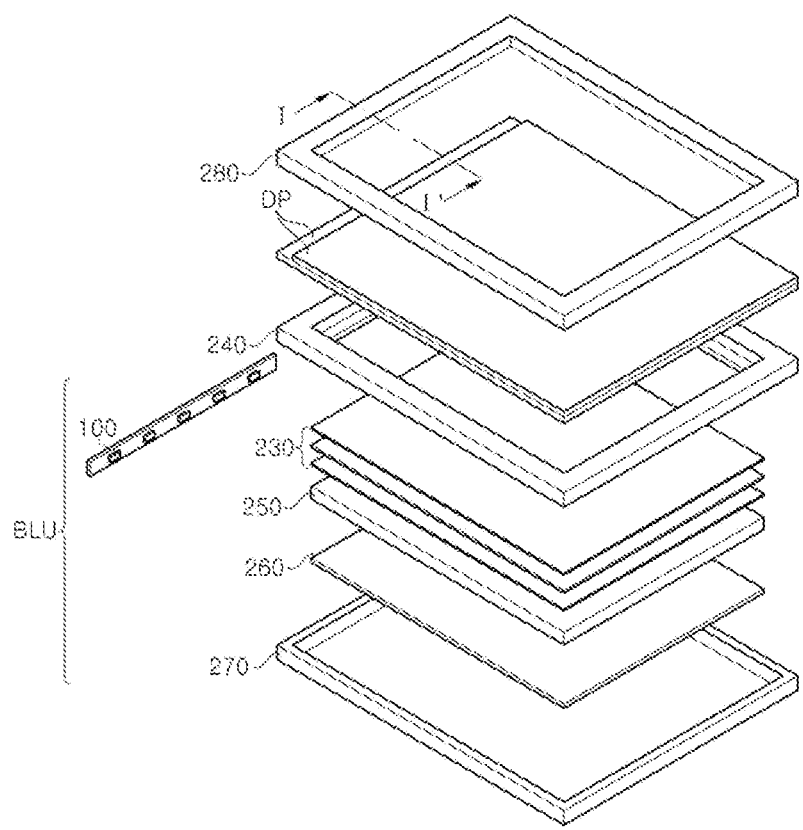
FIG. 3 is an exploded perspective view showing a display device including the light source module of FIG. 1 according to an exemplary embodiment of the present invention.
Figure 4:
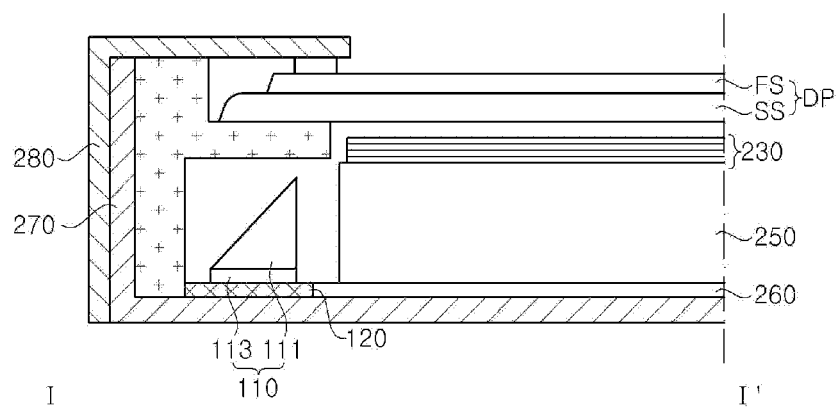
FIG. 4 is a cross-sectional view of the display device taken along line I-I' of FIG. 3.

FIG. 3 is an exploded perspective view showing a display device including the light source module 100 according to an exemplary embodiment of the present invention, and FIG. 4 is a cross-sectional view of the display device taken along line I-I' of FIG. 3.

As shown in FIGS. 3 and 4, a display device including the light source module 100 according to the present exemplary embodiment includes a display panel DP, a top cover 280 enclosing an edge of the display panel DP, a panel guide 240 supporting a lower edge of the display panel DP, and a backlight unit BLU providing light to the display panel DP.

The display panel DP includes a color filter substrate FS and a thin film transistor substrate SS bonded to each other so as to face each other to allow a uniform cell gap to be maintained therebetween. The display panel DP may further include a liquid crystal layer disposed between the color filter substrate FS and the thin film transistor substrate SS.

Although not shown in detail in FIGS. 3 and 4, in the thin film transistor substrate SS, a plurality of gate lines and data lines intersect with each other to define pixels, and thin film transistors (TFTs) are provided at each of intersection regions to one-to-one correspond to and are connected to pixel electrodes mounted in the respective pixels. The color filter substrate FS includes color filters corresponding to the respective pixels and having R, G, and B colors, a black matrix edging each of the color filters and shielding gate lines, data lines, thin film transistors, and the like, and a common electrode covering both of them. Here, the common electrode may also be formed on the thin film transistor substrate SS.

The backlight unit BLU providing light to the display panel DP includes a lower cover 270 having an open upper surface, a reflecting sheet 260 disposed on the lower cover 270, the light source module 100, a light guide plate 250, and optical sheets 230.

Here, the light source module 100 is positioned on a first portion of the lower cover 270 and in parallel with the light guide plate 250. The light source module 100 includes the light emitting diode chip 110, including the substrate 111 and the semiconductor stacking part 113, and the circuit board 120. Since these components of the light source module 100 have been described above with reference to FIGS. 1 and 2, a detailed description thereof will be omitted. A height of the light emitting diode chip 110 corresponds to a thickness of the light guide plate 250.

The light source module 100 also includes the inclined part 112 and the discharging part 114, as described above. The discharging part 114 faces an incident surface of the light guide plate 250. Here, the incident surface may be one side surface of the light guide plate 250.

The discharging part 114 may have a wavelength converting layer (not shown) formed thereon. The wavelength converting layer may include a phosphor configured to convert light from the light emitting diode chip 110 into a desired wavelength. In addition, the wavelength converting layer may have a rugged structure corresponding to the rugged part 119.

The backlight unit BLU according to the present exemplary embodiment may have a reduced thickness compared with a conventional backlight unit, by including the light source module 100 having the high efficiency flip-chip structure.

According to the present exemplary embodiment, a separate reflecting member for guiding light to the light guide plate 250 is omitted due to a structure of the light emitting diode chip 110 having the inclined part 112 and the discharging part 114, such that the light source module 100 having a simplified structure may be provided.

According to the present exemplary embodiment, light loss in the backlight unit BLU is decreased and heat radiation characteristics are excellent, by using the light source module 100 having the high efficiency flip-chip structure.

Figure 5:
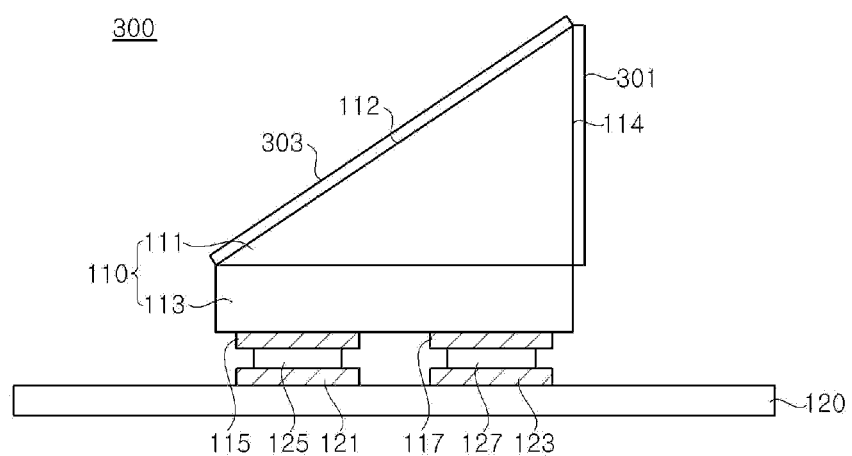
FIG. 5 is a cross-sectional view schematically showing a light source module according to an exemplary embodiment of the present invention.

FIG. 5 is a cross-sectional view schematically showing a light source module according to an exemplary embodiment of the present invention.

As shown in FIG. 5, all components of the light source module 300 are the same as those of the light source module 100 of FIG. 1, except for a wavelength converting layer 301 and a reflecting layer 303. Therefore, repeated features will be denoted by the same reference numerals and a detailed description thereof will be omitted.

The wavelength converting layer 301 is disposed on the discharging part 114 of the substrate 111.

The wavelength converting layer 301 includes a phosphor and has a thickness.

The wavelength converting layer 301 may be formed on the discharging part 114 of the substrate 111, and may also be formed up one side surface of the semiconductor stacking part 113.

The reflecting layer 303 is disposed on the inclined part 112 of the substrate 111.

The reflecting layer 303 may be a distributed Bragg reflector (DBR) (not shown) including layers having different refractive indices. Alternatively, the reflecting layer 303 may be a thin film metal layer (not shown) having high reflectivity.

The reflecting layer 303 may be formed on the inclined part 112 of the substrate 111, and may also be formed up one side surface of the semiconductor stacking part 113. The side surface of the semiconductor stacking part 113 having the reflecting layer 303 formed thereon is opposite to the side surface having the wavelength converting layer 301 formed thereon.

Accordingly, the light source module 300 according to the present exemplary embodiment including the inclined part 112, the reflecting layer 303 disposed on the inclined part 112, the discharging part 114, and the wavelength converting layer 301 disposed on the discharging part 114 has both reduced thickness and high efficiency.

The light source module 300 according to the present exemplary embodiment also has excellent heat radiation characteristics since the light emitting diode chip 110 is mounted on the circuit board 120 by the flip-chip bonding or SMT.

Figure 6:
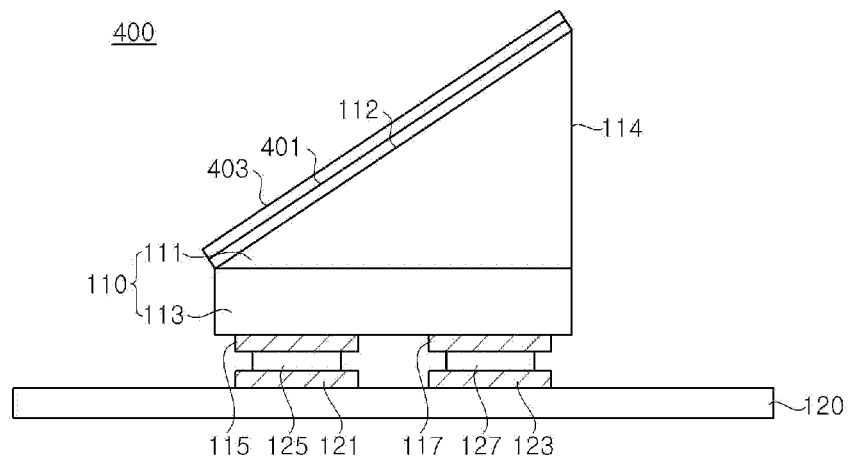
FIG. 6 is a cross-sectional view schematically showing a light source module according to an exemplary embodiment of the present invention.

FIG. 6 is a cross-sectional view schematically showing a light source module according to an exemplary embodiment of the present invention.

As shown in FIG. 6, all components of the light source module 400 are the same as those of the light source module 100 of FIG. 1, except for a wavelength converting layer 401 and a reflecting layer 403. Therefore, repeated features will be denoted by the same reference numerals and a detailed description thereof will be omitted.

The wavelength converting layer 401 is disposed on the inclined part 112 of the substrate 111.

The wavelength converting layer 401 includes a phosphor and has a thickness.

The wavelength converting layer 401 may be formed on the inclined part 112 of the substrate 111, and may also be formed on one side surface of the semiconductor stacking part 113.

The reflecting layer 403 is disposed on the wavelength converting layer 401.

The reflecting layer 403 may be a DBR (not shown) including layers having different refractive indices. Alternatively, the reflecting layer 403 may be a thin film metal layer (not shown) having high reflectivity.

Accordingly, the light source module 400 according to the present exemplary embodiment including the inclined part 112, the wavelength converting layer 401 and the reflecting layer 403 disposed on the inclined part 112, and the discharging part 114 has both reduced thickness and high efficiency.

The light source module 400 according to the present exemplary embodiment also has excellent heat radiation characteristics since the light emitting diode chip 110 is mounted on the circuit board 120 by the flip-chip bonding or SMT.

Figure 7:
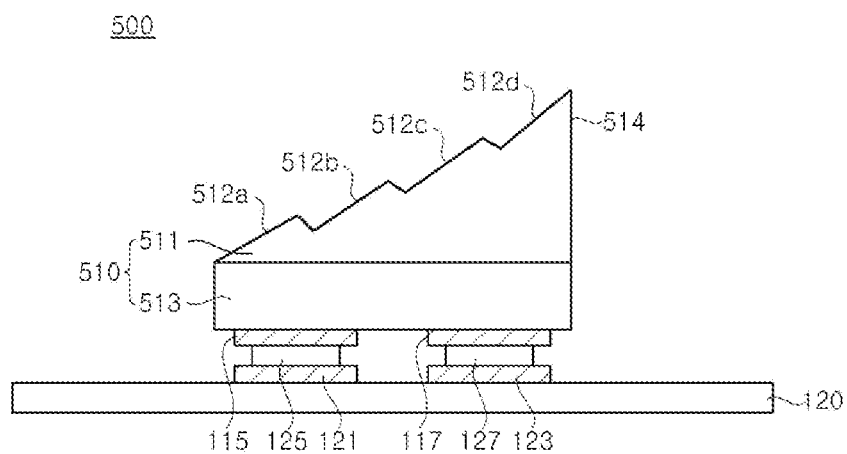
FIG. 7 is a cross-sectional view schematically showing a light source module according to an exemplary embodiment of the present invention.

FIG. 7 is a cross-sectional view schematically showing a light source module according to an exemplary embodiment of the present invention.

As shown in FIG. 7, all components of the light source module 500 are the same as those of the light source module 100 of FIG. 1, except for a substrate 511. Therefore, repeated features will be denoted by the same reference numerals and a detailed description thereof will be omitted.

The light emitting diode chip 510 includes a substrate 511 and a semiconductor stacking part 513.

The substrate 511 includes inclined parts 512a, 512b, 512c, and 512d, and a discharging part 514.

The inclined parts 512a to 512d are formed on the substrate 511, and have an inclined angle with reference to an upper surface of the semiconductor stacking part 513. The inclined parts 512a to 512d have an inclined "stair" structure. That is, inclined angles formed by the inclined parts 512a to 512d and the upper surface of the semiconductor stacking parts 513 are the same as each other, and the inclined parts 512a to 512d are arranged in parallel with each other and are spaced apart from each other by an interval.

Alternatively, the inclined angles formed by the inclined parts 512a to 512d and the upper surface of the semiconductor stacking parts 513 may be different from each other.

Although not shown in detail in FIG. 7, reflecting layer including a DBR (not shown) or a thin film metal layer (not shown) may be formed on the inclined parts 512a to 512d, and a wavelength converting layer (not shown) may be formed on the discharging part 514. The reflecting layer and the wavelength converting layer may be substantially the same as the reflecting layer 303 and the wavelength converting layer 301 described above with respect to FIG. 6. Alternatively, the wavelength converting layer (not shown) may be formed on the inclined parts 512a to 512d, and the DBR (not shown) or the thin film metal layer (not shown) may be formed on the wavelength converting layer (not shown).

In the light source module 500 according to the present exemplary embodiment, the inclined parts 512a to 512d are formed in the inclined stair structure, thereby making it possible to decrease a thickness of the substrate 511. Therefore, the light source module 500 may be used in an ultra-thin backlight unit.

The light source module 500 according to the present exemplary embodiment includes the inclined parts 512a to 512d and the discharging part 514, and has both reduced thickness and high efficiency.

The light source module 500 according to the present exemplary embodiment also has excellent heat radiation characteristics since the light emitting diode chip 510 is mounted on the circuit board 120 by the flip-chip bonding or SMT.

Figure 8:
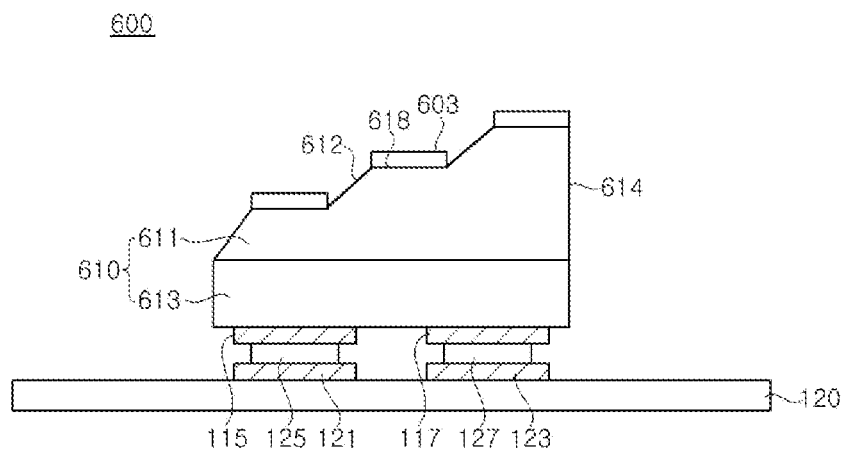
FIG. 8 is a cross-sectional view schematically showing a light source module according to an exemplary embodiment of the present invention.

FIG. 8 is a cross-sectional view schematically showing a light source module according to an exemplary exemplary embodiment of the present invention.

As shown in FIG. 8, all components of the light source module 600 are the same as those of the light source module 100 of FIG. 1, except for a light emitting diode chip 610. Therefore, repeated features will be denoted by the same reference numerals and a detailed description thereof will be omitted.

The light emitting diode chip 610 includes a substrate 611 and a semiconductor stacking part 613.

The substrate 611 includes inclined parts 612, horizontal parts 618, and a discharging part 614.

The inclined parts 612 are formed on the substrate 611, and have an inclined angle with reference to an upper surface of the semiconductor stacking part 613. The inclined parts 612 have an inclined "stair" structure. That is, inclined angles formed by the inclined parts 612 and the upper surface of the semiconductor stacking parts 613 are the same as each other, and the inclined parts 612 are arranged in parallel with each other and are spaced apart from each other by an interval.

Alternatively, the inclined angles formed by the inclined parts 612 and the upper surface of the semiconductor stacking parts 613 may be different from each other.

The horizontal parts 618 may extend from the inclined parts 612, be disposed between the inclined parts 612, and be disposed between the inclined part 612 and the discharging part 614. The horizontal parts 618 may be formed in a direction that is parallel with the upper surface of the semiconductor stacking part 613 and is perpendicular to the discharging part 614.

The horizontal parts 618 include a DBR (603) disposed thereon. Here, the DBR 603 may be replaced by a thin film metal layer (not shown).

The DBR 603 may also be disposed on the inclined parts 612.

The discharging part 614 may have a wavelength converting layer (not shown) formed thereon. In addition, the wavelength converting layer (not shown) may also be formed on the inclined parts 612 and the plurality of horizontal parts 618.

In the light source module 600 according to the present exemplary embodiment, the inclined parts 612 and the horizontal parts 618 are formed in the inclined stair structure, thereby making it possible to decrease a thickness of the substrate 611.

The light source module 600 according to the present exemplary embodiment includes the inclined parts 612, the plurality of horizontal parts 618, and the discharging part 614, and has both reduced thickness and high efficiency.

The light source module 600 according to the present exemplary embodiment also has excellent heat radiation characteristics since the light emitting diode chip 610 is mounted on the circuit board 120 by the flip-chip bonding or SMT.

According to exemplary embodiments of the present invention, a light source module includes an inclined part that reduces thickness and has high efficiency, and a discharging part positioned at a side surface of a light emitting diode chip, such that the light source module may be implemented in the side surface light emitting device.

In addition, the light source module according to exemplary embodiments of the present invention has excellent heat radiation characteristics since the light emitting diode chip is mounted on the circuit board by the flip-chip bonding or SMT.

A backlight unit according to an exemplary embodiment of the present invention may have a reduced thickness compared with a conventional backlight unit, by including a light source module having the high efficiency flip-chip structure.

According to an exemplary embodiment of the present invention, a separate reflecting member for guiding light to a light guide plate is omitted due to a structure of the light emitting diode chip having the inclined part and the discharging part, such that the light source module having a simplified structure may be provided.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light source module, comprising:
a circuit board;
board pads disposed on the circuit board;
a light emitting diode chip disposed on the board pads; and
a wavelength converting layer disposed on the discharging part,
wherein:
the light emitting diode chip comprises a substrate and a semiconductor stacking part disposed between the substrate and the circuit board;
the substrate comprises an inclined part disposed at an upper portion thereof and a discharging part disposed at one side surface thereof; and
the wavelength converting layer is disposed on a first side surface of the semiconductor stacking part.

2. The light source module of claim 1, wherein the inclined part has an inclined angle with reference to an upper surface of the semiconductor stacking part.

3. The light source module of claim 1, wherein the inclined part comprises an inclined stair structure comprising inclined parts.

4. The light source module of claim 1, wherein the inclined part comprises an inclined stair structure comprising inclined part portions and horizontal parts.

5. The light source module of claim 1, wherein:
the inclined part comprises inclined part portions;
inclined angles formed by the inclined part portions and an upper surface of the semiconductor stacking part are the same as each other; and
the inclined parts are formed parallel to and spaced apart from each other.

6. The light source module of claim 1, wherein:
the inclined part comprises inclined part portions; and
inclined angles formed by the inclined part portions and an upper surface of the semiconductor stacking part are different from each other.

7. The light source module of claim 1, further comprising:
a distributed Bragg reflector (DBR) or a thin film metal layer disposed on the inclined part; and
a wavelength converting layer disposed on the DBR or the thin film metal layer,
wherein the DBR or the thin film metal layer is disposed on a second side surface of the semiconductor stacking part opposite to the first side surface.

8. A light source module, comprising:
a circuit board;
board pads disposed on the circuit board; and
a light emitting diode chip disposed on the board pads,
wherein:
the light emitting diode chip comprises a substrate and a semiconductor stacking part disposed between the substrate and the circuit board;
the substrate comprises an inclined part disposed at an upper portion thereof and a discharging part disposed at one side surface thereof; and
the discharging part comprises a rugged part comprising a concavo-convex shape.

9. A backlight unit, comprising:
a light guide plate;
a circuit board disposed on a first side of the light guide plate;
board pads disposed on the circuit board; and
a light emitting diode chip disposed on the board pads,
wherein:
the light emitting diode chip comprises a substrate and a semiconductor stacking part disposed between the substrate and the circuit board;
the substrate comprises an inclined part disposed at an upper portion thereof and a discharging part disposed at one side surface thereof; and
the wavelength converting layer is disposed on a first side surface of the semiconductor stacking part.

10. The backlight unit of claim 9, wherein the discharging part and an incident surface of the light guide plate face each other.

11. The backlight unit of claim 9, wherein the inclined part has an inclined angle with reference to an upper surface of the semiconductor stacking part.

12. The backlight unit of claim 9, wherein the inclined part comprises an inclined stair structure comprising inclined parts.

13. The backlight unit of claim 9, wherein the inclined part comprises an inclined stair structure comprising inclined part portions and horizontal parts.

14. The backlight unit of claim 9, wherein:
the inclined part comprises inclined part portions;
inclined angles formed by the inclined part portions and an upper surface of the semiconductor stacking part are the same as each other; and
the inclined parts are formed parallel to and spaced apart from each other.

15. The backlight unit of claim 9, wherein:
the inclined part comprises inclined part portions; and
inclined angles formed by the inclined part portions and an upper surface of the semiconductor stacking part are different from each other.

16. The backlight unit of claim 9, further comprising a wavelength converting layer disposed on the discharging part.

17. The backlight unit of claim 9, further comprising:
a distributed Bragg reflector (DBR) or a thin film metal layer disposed on the inclined part; and
a wavelength converting layer disposed on the DBR or the thin film metal layer,
wherein the DBR or the thin film metal layer is disposed on a second side surface of the semiconductor stacking part opposite to the first side surface.

18. A backlight unit, comprising:
a light guide plate;
a circuit board disposed on a first side of the light guide plate;
board pads disposed on the circuit board; and
a light emitting diode chip disposed on the board pads, wherein:
the light emitting diode chip comprises a substrate and a semiconductor stacking part disposed between the substrate and the circuit board;
the substrate comprises an inclined part disposed at an upper portion thereof and a discharging part disposed at one side surface thereof; and
the discharging part comprises a rugged part comprising a concavo-convex shape.

* * * * *